United States Patent
Akita et al.

(10) Patent No.: US 6,313,674 B1
(45) Date of Patent: Nov. 6, 2001

(54) SYNCHRONIZING CIRCUIT FOR GENERATING INTERNAL SIGNAL SYNCHRONIZED TO EXTERNAL SIGNAL

(75) Inventors: Hironobu Akita; Satoshi Eto, both of Yokohama; Katsuaki Isobe, Kawasaki, all of (JP)

(73) Assignees: Kabushiki Kaisha Toshiba; Fujitsu Limited, both of Kawasaki (JP)

( * ) Notice: Subject to any disclaimer, the term of this patent is extended or adjusted under 35 U.S.C. 154(b) by 0 days.

(21) Appl. No.: 09/641,139

(22) Filed: Aug. 16, 2000

(30) Foreign Application Priority Data

Aug. 17, 1999 (JP) .................................... 11-230702
Aug. 11, 2000 (JP) .................................... 12-244839

(51) Int. Cl.[7] ........................................................ H03L 7/06
(52) U.S. Cl. ............................................ 327/155; 327/161
(58) Field of Search .................................. 327/141, 144, 327/146, 149, 153, 155, 158, 161, 270; 326/96; 365/233

(56) References Cited

U.S. PATENT DOCUMENTS 5,900,752 * 5/1999 Mar ....................................... 327/143

OTHER PUBLICATIONS

A. Hatakeyama, et al., "A 256Mb SDRAM Using a Register–Controlled Digital DLL", ISSCC Digest of Technical Papers, pp. 72–73, Feb. 1997.

Takanori Saeki, et al, "A 10ps Jitter 2 Clock Cycle Lock Time CMOS Digital Clock Generator Based on an Interleaved Synchronous Mirror Delay Scheme", Symposium on VLSI Circuits Digest of Technical Papers, pp. 109–110, Jun. 1999.

* cited by examiner

Primary Examiner—Kenneth B. Wells
Assistant Examiner—Paul Dinh
(74) Attorney, Agent, or Firm—Banner & Witcoff, Ltd.

(57) ABSTRACT

A variable delay line outputs a clock signal advanced in phase by a time corresponding to a sum tH+tL of a time tH required to output high level data from an OCD circuit and a time tL required to output low level data from the OCD circuit. A replica circuit for outputting low level data has the same configuration as a circuit portion of the OCD circuit through which low level data passes. The replica circuit outputs a start signal SSH for outputting high level data from the OCD circuit. Another replica circuit for outputting high level data has the same configuration as a circuit portion of the OCD circuit through which high level data passes. The replica circuit outputs a start signal SSL for outputting low level data from the OCD circuit.

20 Claims, 10 Drawing Sheets

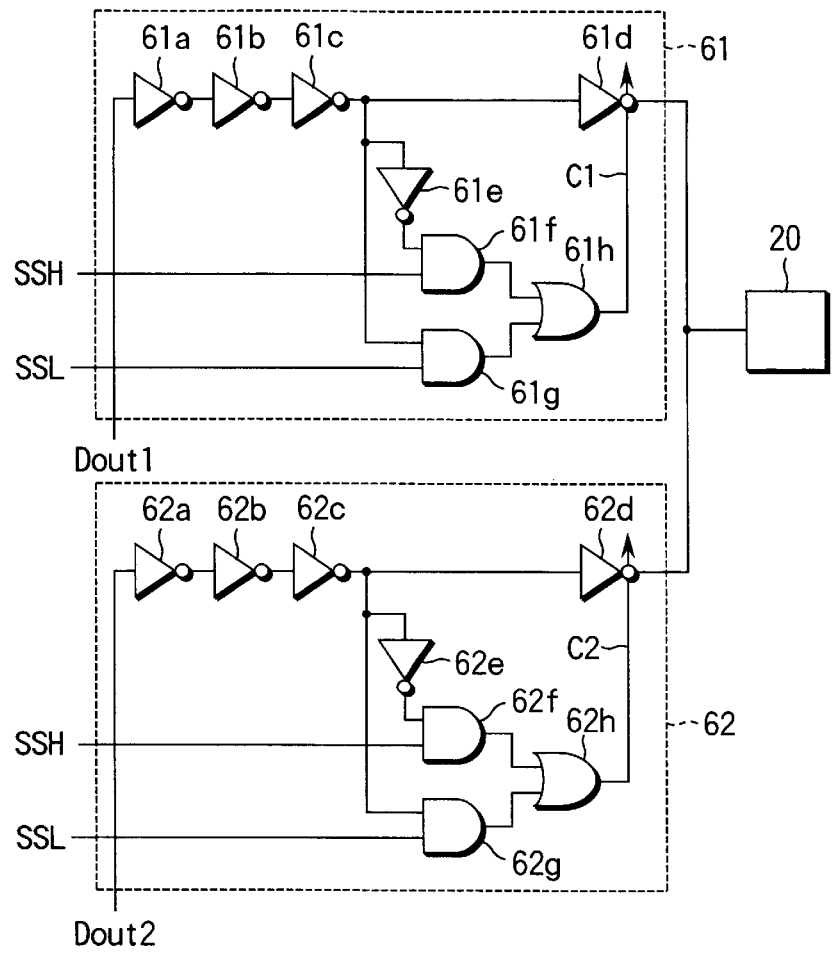
FIG. 7
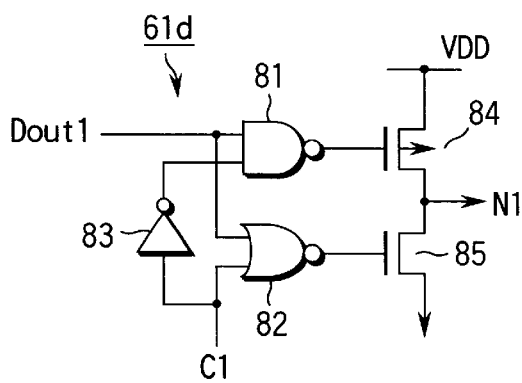
FIG. 8A
FIG. 8B
| Dout1 | 1 | 1 | 0 | 0 |
|---|---|---|---|---|
| C1 | 0 | 1 | 0 | 1 |
| N1 | 1 | Hi-Z | 0 | Hi-Z |

SYNCHRONIZING CIRCUIT FOR GENERATING INTERNAL SIGNAL SYNCHRONIZED TO EXTERNAL SIGNAL

CROSS-REFERENCE TO RELATED APPLICATIONS

This application is based upon and claims the benefit of priority from the prior Japanese Patent Applications No. 11-230702, filed Aug. 17, 1999; and No. 2000-244839, filed Aug. 11, 2000, the entire contents of which are incorporated herein by reference.

BACKGROUND OF THE INVENTION

The present invention relates to a synchronizing circuit applied to a semiconductor integrated circuit, such as a synchronous DRAM or a synchronous SRAM, which operates in synchronism with, for example, a clock signal.

In general, a semiconductor integrated circuit for outputting data in synchronism with an external clock signal has a synchronizing circuit therein. This synchronizing circuit controls an output circuit in synchronism with an external clock signal or an internal clock signal having the same period as an external clock signal. As a result, data is output from the output circuit.

FIG. 15 schematically shows the configuration of a data output section of a conventional semiconductor integrated circuit. Data Dout read out from, for example, a memory cell array which is not illustrated is supplied to an output pad 2 via an off-chip driver circuit (hereafter referred to as OCD circuit) 1 serving as an output buffer disposed in a peripheral portion of the semiconductor integrated circuit. This OCD circuit 1 is formed of, for example, a tri-state buffer circuit and logic gates, and driven according to a data output start signal outputted from a synchronizing circuit 3.

The synchronizing circuit 3 has, for example, an input terminal of an internal clock signal CLK, an output terminal of the data output start signal, and terminals X1 and X0 for connection to a replica circuit 4. The replica circuit 4 has, for example, the same configuration as that of the OCD circuit 1 and has a delay time equal to that of the OCD circuit 1. In the synchronizing circuit 3, the internal clock signal CLK is quickened in phase by a delay time set in the replica circuit 4, and outputted as the data output start signal. Therefore, the OCD circuit 1 can output data Dout to the output pad 2 in synchronism with the external clock signal.

In a semiconductor integrated circuit using the above described synchronizing circuit, a P-channel MOS transistor and an N-channel MOS transistor included in the OCD circuit 1 sometimes do not coincide in current drive capability because of dispersion of the fabrication process or the like. In some cases, therefore, the drive capability for data of the high level "H" and the drive capability for data of the low level "L" become unbalanced.

FIG. 16 shows the case where the current drive capability of an N-channel MOS transistor of, for example, a final stage included in the OCD circuit 1 has become greater than the current drive capability of a P-channel MOS transistor. If the current drive capability of the N-channel MOS transistor differs from the current drive capability of the P-channel MOS transistor, then the time required since the data output start signal is activated until the high level output voltage VDout becomes a predetermined level differs from the time required until the low level output voltage VDout becomes a predetermined level. In other words, in this case, it takes a longer time to output high level data than low level data.

Therefore, the output voltage VDout of the OCD circuit 1 includes jitter depending upon data of the high level or low level. The jitter has a length of at most approximately 100 ps. As the signal frequency increases, however, its influence becomes great, resulting in a problem.

As described above, the data output start signal is compensated for the delay time in the OCD circuit as compared with the external clock signal. In the conventional technique, however, only the delay for the high level data is compensated. As for the low level data, it is set to the center condition (standard condition) of the process, and compensation for dispersion of the process is not especially conducted. Therefore, there is considered a circuit for compensating jitter in high level data and low level data.

FIG. 17 shows a circuit in which a start signal of the case where high level data is outputted from the OCD circuit is made different from a start signal of the case where low level data is outputted from the OCD circuit. In other words, a synchronizing circuit 5 for generating a start signal of the case where high level data is outputted and a synchronizing circuit 6 for generating a start signal of the case where low level data is outputted are connected to the OCD circuit 1. In the synchronizing circuit 5, for example, a replica circuit 5a of the OCD circuit for outputting low level data is provided. In the synchronizing circuit 6, for example, a replica circuit 6a of the OCD circuit for outputting high level data is provided. When outputting the high level data and the low level data, data output start signals according to the delays of the OCD circuit 1 are thus used, respectively. As a result, jitter of VDout of the high level data and the low level data can be dissolved.

In the case of the circuit shown in FIG. 17, two synchronizing circuits are needed in order to generate the start signal of the case where high level data is outputted and start signal of the case where low level data is outputted. Therefore, there occurs a problem that the area occupied by the synchronizing circuit in the semiconductor integrated circuit becomes great and large power consumption is required.

BRIEF SUMMARY OF THE INVENTION

The present invention has been made in order to solve the above described problems. An object of the present invention is to provide a synchronizing circuit capable of suppressing the increase of the occupied area in the semiconductor integrated circuit and reducing the power consumption.

The object of the present invention is achieved by a synchronizing circuit including: an output circuit for outputting high level data and low level data, the output circuit having a first circuit for outputting the high level data in response to a first start signal having a period equal to a period of a clock signal and a second circuit for outputting the low level data in response to a second start signal having a period equal to the period of the clock signal; a first signal generation circuit supplied with the clock signal, the first signal generation circuit advancing a phase of the clock signal substantially by a total of a first delay time caused when the first circuit outputs high level data and a second delay time caused when the second circuit outputs low level data; a second signal generation circuit having a delay time substantially equal to the second delay time of the second circuit, the second signal generation circuit delaying a signal outputted from the first signal generation circuit, and generating the first start signal for starting the first circuit of the output circuit by using the delayed signal; and a third signal generation circuit having a delay time substantially equal to the first delay time of the first circuit, the third signal generation circuit delaying a signal outputted from the first signal generation circuit, and generating the second start signal for starting the second circuit of the output circuit by using the delayed signal.

Furthermore, the object of the present invention is achieved by a synchronizing circuit including: an input buffer supplied with a clock signal; a first delay circuit supplied with an output signal of the input buffer, the first delay circuit being varied in delay time; a first output buffer supplied with an output signal of the first delay circuit; a second output buffer supplied with the output signal of the first delay circuit; a first replica circuit supplied with an output signal of the first buffer, the first replica circuit having same configuration as that of a circuit portion of an output circuit for outputting a high level signal; a second replica circuit supplied with an output signal of the second buffer, the second replica circuit having same configuration as that of a circuit portion of an output circuit for outputting a low level signal; an output circuit supplied with output signals of the first and second replica circuits, the output circuit outputting data supplied from a memory cell in response to output signals of the first and second replica circuits; a second delay circuit supplied with the output signal of the first delay circuit, the second delay circuit having a third replica circuit including a replica circuit for the first and second output buffers and a fourth replica circuit the first and second replica circuits; a fifth replica circuit supplied with an output signal of the second delay circuit, the fifth replica circuit having same configuration as that of the input buffer; and a phase comparator for comparing a phase of an output signal of the fifth replica circuit with a phase of the output signal of the input buffer, the phase comparator controlling the first delay circuit in response to a phase difference between the output signal of the fifth replica circuit and the output signal of the input buffer.

Furthermore, the object of the present invention is achieved by a synchronizing circuit including: a first output circuit supplied with first data outputted from a memory cell array, the first output circuit outputting the first data, the first output circuit having a first circuit for outputting high level data in response to a first start signal having a period equal to a period of a clock signal and a second circuit for outputting low level data in response to a second start signal having a period equal to the period of the clock signal; a second output circuit supplied with second data outputted from the memory cell array, the second output circuit outputting the second data, the second output circuit having a third circuit for outputting high level data in response to a third start signal having a period equal to a period of the clock signal and a fourth circuit for outputting low level data in response to a fourth start signal having a period equal to the period of the clock signal; a first synchronizing circuit for generating the first and second start signals in response to the clock signal; and a second synchronizing circuit for generating the third and fourth start signals in response to an inverted signal of the clock signal.

Furthermore, the object of the present invention is achieved by a synchronizing circuit including: a first buffer circuit supplied with first data outputted from a memory cell array, the first buffer circuit outputting the first data, the first buffer circuit having a first circuit for outputting high level data in response to a first start signal having a period equal to a period of a clock signal and a second circuit for outputting low level data in response to a second start signal having a period equal to the period of the clock signal; a second buffer circuit supplied with second data outputted from the memory cell array, the second buffer circuit outputting the second data, the second buffer circuit having a third circuit for outputting high level data in response to a third start signal having a period equal to a period of the clock signal and a fourth circuit for outputting low level data in response to a fourth start signal having a period equal to the period of the clock signal; an output circuit supplied with output signals of the first and second buffer circuits;

a first synchronizing circuit for generating the first and second start signals in response to the clock signal; and a second synchronizing circuit for generating the third and fourth start signals in response to an inverted signal of the clock signal.

Furthermore, the object of the present invention is achieved by a synchronizing circuit including: a parallel-to-serial conversion circuit supplied with first and second data outputted from a memory cell array, the parallel-to-serial conversion circuit successively outputting the first and second data; a shift register supplied with an output signal of the parallel-to-serial conversion circuit, the shift register having a first circuit for outputting high level data and a second circuit for outputting low level data; an output circuit supplied with an output signal of the shift register; a control circuit connected to the shift register, the control circuit generating a control signal in response to the output signal of the parallel-to-serial conversion circuit, a first start signal for outputting high level data, and a second start signal for outputting low level data, each of the first and second start signals having a period equal to a period of the clock signal, the control signal being supplied to the shift register; and a start signal generation circuit for generating the first and second start signals in response to the clock signal.

According to the present invention, it is possible to provide a synchronizing circuit capable of suppressing the increase of the occupied area in the semiconductor integrated circuit and reducing the poser dissipation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a circuit diagram concretely showing a part of the configuration of FIG. 6;

FIG. 8A is a circuit diagram showing an example of a tri-state buffer circuit illustrated in FIG. 7;

FIG. 8B is a diagram showing the operation of the circuit shown in FIG. 8A;

DETAILED DESCRIPTION OF THE INVENTION

Figure 1:
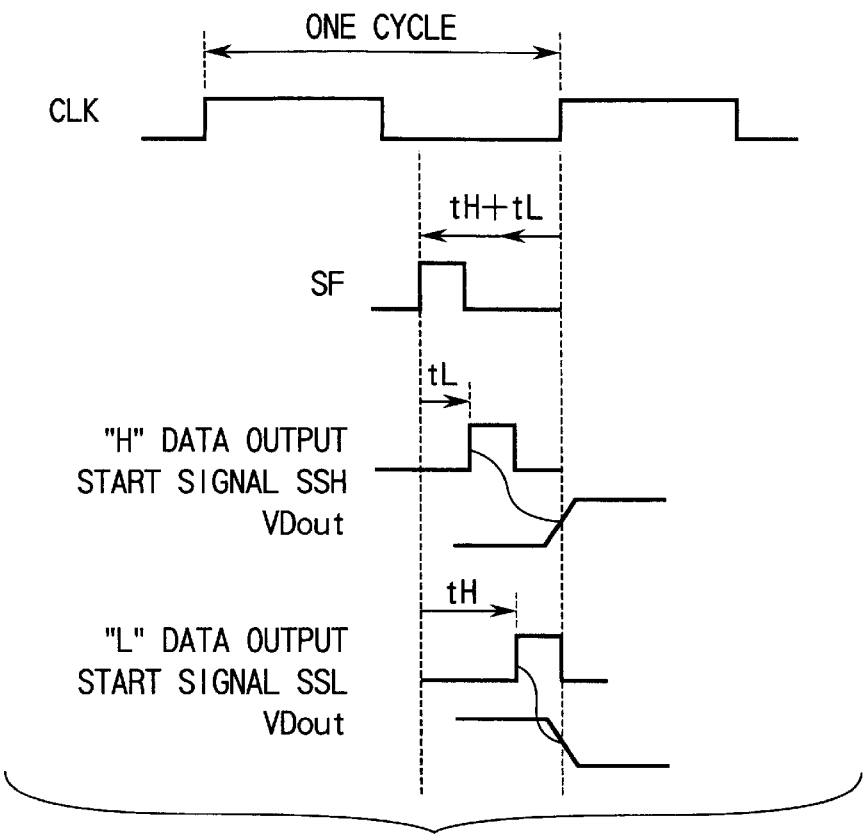
FIG. 1 is a diagram showing the principle of the present invention.

Hereafter, embodiments of the present invention will be described by referring to the drawing.

FIG. 1 shows the principle of the present invention. At a rising edge of an external clock signal (or an internal clock signal synchronized to an external clock signal) CLK, an output voltage VDout of an OCD circuit crosses a predetermined high level or a predetermined low level. Furthermore, FIG. 1 shows the case where the current drive capability of a P-channel MOS transistor is lowered or the current drive capability of an N-channel MOS transistor is raised by dispersion of the fabrication process.

Under the above described condition, in the present invention, one synchronizing circuit and an OCD circuit generate data output start signals of two kinds respectively for compensating a delay of the case where high level data is outputted and a delay of the case where low level data is outputted. In other words, in the present invention, there is generated a signal SF advanced in phase by a time corresponding to the sum tH+tL of a time tH required to output high level data from the OCD circuit and a time tL required to output low level data. Furthermore, from the signal SF advanced in phase, there are generated a high level data output start signal SSH for outputting high level data and a low level data output start signal SSL for outputting low level data. In other words, the start signal SSH is generated by delaying the signal SF advanced in phase, by the time tL required to output low level data. Furthermore, the start signal SSL is generated by delaying the signal SF advanced in phase, by the time tH required to output high level data. In both the case where high level data is outputted and the case where low level data is outputted, the voltage VDout outputted from the OCD circuit can be synchronized to the external clock signal CLK.

First Embodiment

Figure 2:
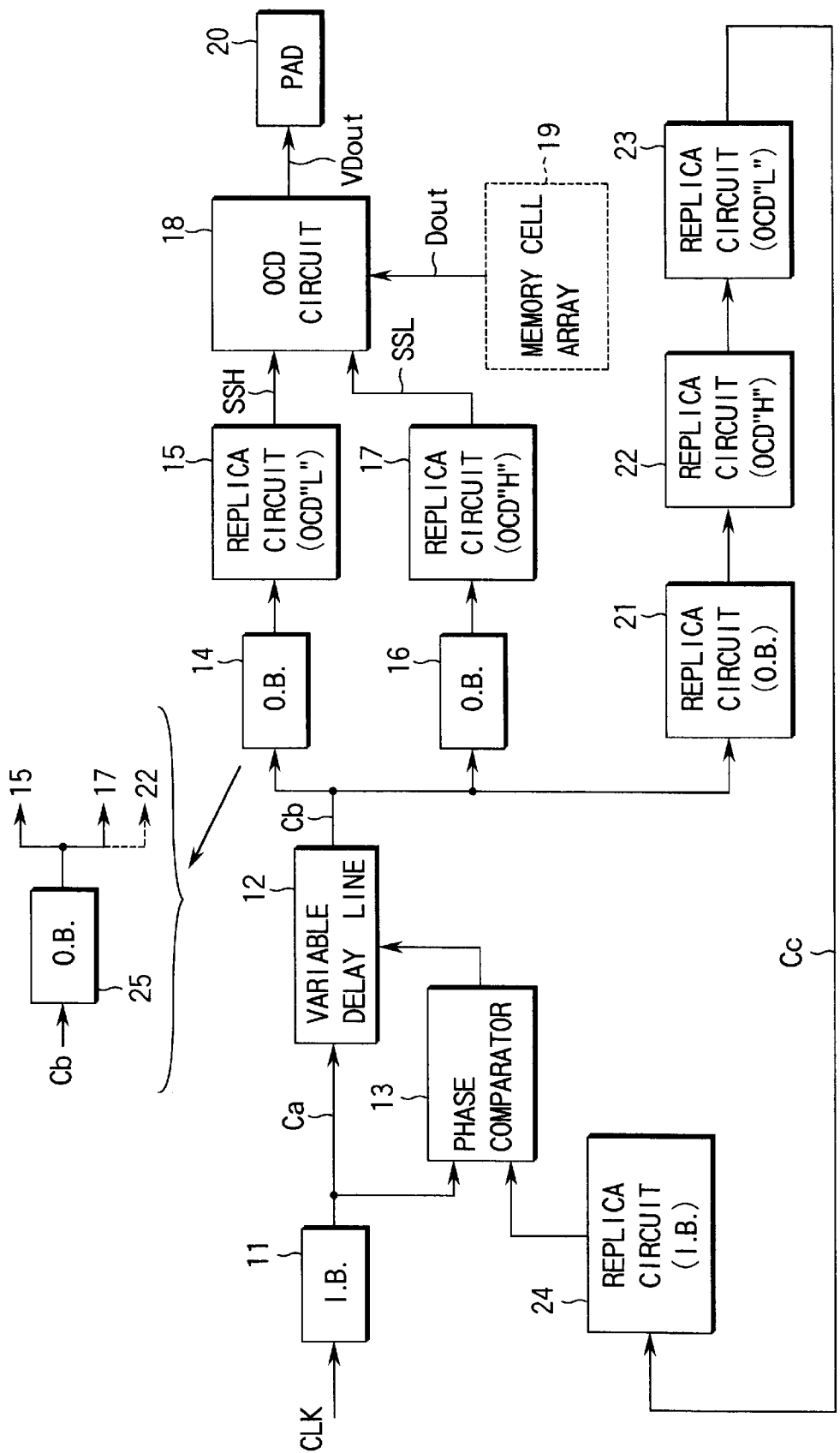
FIG. 2 is a configuration diagram showing a first embodiment of the present invention in which the present invention is applied to a delay locked loop.

FIG. 2 shows a first embodiment of the present invention in which the present invention is applied to a delay locked loop (hereafter referred to as DLL). This DLL is disclosed for example, in "A 256 Mb SDRAM Using Register-Controlled Digital DLL," (Digest of Technical Papers of ISSCC '97). In such a DLL, a circuit having the same configuration as an output buffer is used as a replica circuit of an OCD circuit.

In the first embodiment, for example, an external clock signal CLK (or an internal clock signal having the same period as that of an external clock signal) is supplied to an input buffer (I.B.) 11. This input buffer 11 delays the clock signal CLK by a predetermined time. An output signal Ca of the input buffer 11 is supplied to a variable delay line 12 and a first input terminal of a phase comparator 13. The variable delay line 12 is formed of, for example, a logic gate chain including a plurality of cascade-connected logic gates. The delay value of the variable delay line 12 is controlled by an output signal of the phase comparator 13. An output signal Cb of the variable delay line 12 is a clock signal advanced in phase by the sum tH+tL of a time tH required to output a high level voltage from an OCD circuit 18 and a time tL required to output a low level voltage, and a time corresponding to delays of output buffers 14 and 16 described later.

An output signal Cb of the variable delay line 12 is supplied to a replica circuit 15 via an output buffer (O.B.) 14. This replica circuit 15 has the same configuration as a circuit portion of the OCD circuit 18 through which low level data passes. Furthermore, the output signal Cb of the variable delay line 12 is supplied to a replica circuit 17 via an output buffer (O.B.) 16. This replica circuit 17 has the same configuration as a circuit portion of the OCD circuit 18 through which high level data passes. A high level data output start signal SSH outputted from the replica circuit 15 and a low level data output start signal SSL outputted from the replica circuit 17 are supplied to the OCD circuit 18. According to the start signals SSH and SSL, the OCD circuit 18 outputs data read out from, for example, a memory cell 19 to an output pad 20. The OCD circuit 18 has the same configuration as that of the OCD circuit 1 shown in, for example, FIG. 8A.

In addition, the output signal Cb of the variable delay line 12 is supplied to, for example, a replica circuit 21. This replica circuit 21 has the same configuration as that of, for example, the output buffers 14 and 16. However, this replica circuit 21 is not restricted to the replica circuit of an output buffer, but may be the output buffer itself. An output signal of the replica circuit 21 is supplied to a replica circuit 22. The replica circuit 22 has the same configuration as that of the replica circuit 17. The replica circuit 22 has the same configuration as a circuit portion of the OCD circuit 18 through which high level data passes. An output signal of the replica circuit 22 is supplied to a replica circuit 23. The replica circuit 23 has the same configuration as that of the replica circuit 15. The replica circuit 23 has the same configuration as a circuit portion of the OCD circuit 18 through which low level data passes. Arrangement of the replica circuits 22 and 23 is not restricted to that shown in FIG. 2, but the order of the replica circuits 22 and 23 may be reversed. The order of them may be set according to the state. Furthermore, the two replica circuits 22 and 23 need not be used, but one replica circuit having a delay equivalent to the total of delays of these replica circuits 22 and 23 may be provided.

An output signal Cc of the replica circuit 23 is supplied to a replica circuit 24. The replica circuit 24 is a circuit having the same configuration as that of, for example, the input buffer 11. An output signal of the replica circuit 24 is supplied to a second input terminal of the phase comparator 13. The phase comparator 13 compares the phase of the clock signal Cc delayed by the replica circuits 21, 22, 23 and 24 with the phase of the clock signal Ca supplied from the input buffer 11 cycle by cycle, and controls the delay value of the variable delay line 12 according to the phase difference between them.

In stages preceding those of the replica circuits 15 and 17, the output buffers 14 and 16 are provided, respectively. However, the present embodiment is not restricted to this, but it is also possible that one output buffer 25 receives the output signal of the variable delay line 12 and an output signal of the output buffer 25 is supplied to the replica circuits 15 and 17. Or the output signal of the output buffer 25 may be supplied to the replica circuits 15, 17 and 22. In this case, the replica circuit 21 can be omitted.

Figure 3:
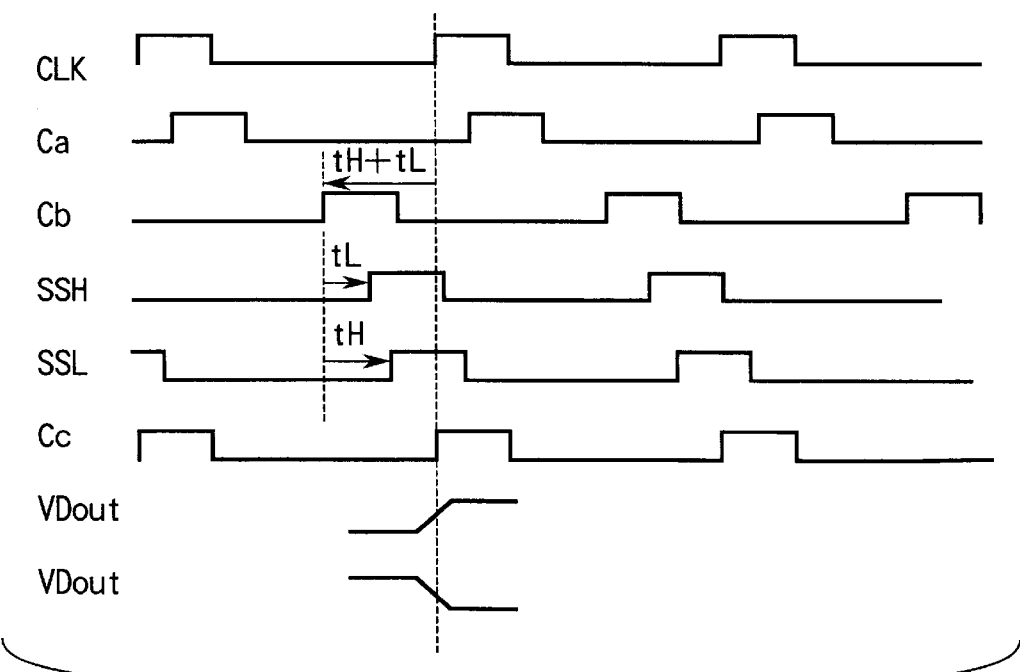
FIG. 3 is a time chart showing the operation of the configuration of FIG. 2.

FIG. 3 shows the operation of the configuration of FIG. 2. Components of FIG. 2 operate according to the timing shown in FIG. 3. The clock signal supplied to the input buffer 11 is delayed by a predetermined time. The output signal Ca of the input buffer 11 is supplied to the variable delay line 12 controlled by the output signal of the phase comparator 13. The variable delay line 12 generates a clock signal Cb based on the signal Ca and the output signal of the phase comparator 13. The clock signal Cb is advanced in phase by a time corresponding to the sum tH+tL of the delays of the replica circuits 22 and 23 and a time corresponding to the delay of the output buffers 14 and 16. In FIG. 3, the delay of the output buffers is omitted and not illustrated. The clock signal Cb is supplied to the replica circuits 15 and 17 via the output buffers 14 and 16, respectively. In the replica circuit 15, the clock signal Cb is delayed by a delay time tL of a circuit portion of the OCD circuit 18 through which the low level data passes, and outputted as the high level data output start signal SSH. In the replica circuit 17, the clock signal Cb is delayed by a delay time tH of a circuit portion of the OCD circuit 18 through which the high level data passes, and outputted as the low level data output start signal SSL. The high level data output start signal SSH outputted from the replica circuit 15, and the low level data output start signal SSL outputted from the replica circuit 17 are supplied to the OCD circuit 18. In the OCD circuit 18, therefore, timing in the case where high level data read out from a memory cell array 19 is outputted and timing in the case where low level data is outputted can be made to coincide with each other. Therefore, the output signal VDout outputted from the OCD circuit 18 can be synchronized to the clock signal CLK.

In the above described first embodiment, the clock signal CLK is advanced in phase by the total of the delay time of a circuit portion of the OCD circuit 18 through which the high level data passes and the delay time of a circuit portion of the OCD circuit 18 through which the low level data passes, by using the variable delay line 12. The clock signal advanced in phase is delayed by a delay time of a circuit portion of the OCD circuit 18 through which the low level data passes, and thereby the high level data output start signal SSH of the OCD circuit 18 is generated. The clock signal advanced in phase is delayed by a delay time of a circuit portion of the OCD circuit 18 through which the high level data passes, and thereby the low level data output start signal SSL of the OCD circuit 18 is generated. In other words, in the first embodiment, it is possible to generate the high level data output start signal SSH and the low level data output start signal SSL by using one variable delay line 12. As a result, the number of the delay lines can be reduced to half as compared with the conventional technique. In the synchronizing circuit, the area occupied by the delay lines and power dissipation of the delay lines are great as compared with other circuit portions. Owing to such reduction of the number of delay lines to half, therefore, the occupied area and the power dissipation can be advantageously reduced.

In addition, the delay line is in general a logic chain obtained by cascade-connection of a plurality of logic circuits. Therefore, noise is generated by operation of the delay line. In the first embodiment, however, the number of the delay lines is half of that of the conventional technique, and consequently the noise quantity can also be advantageously reduced to half.

Furthermore, the output timing of the high level data and the output timing of the low level data can be made to coincide with each other. As a result, jitter depending upon the data level can be reduced, and data can be outputted at high speed. In addition, it is possible to prevent lowering of the synchronization speed and complication of control.

Second Embodiment

Figure 4:
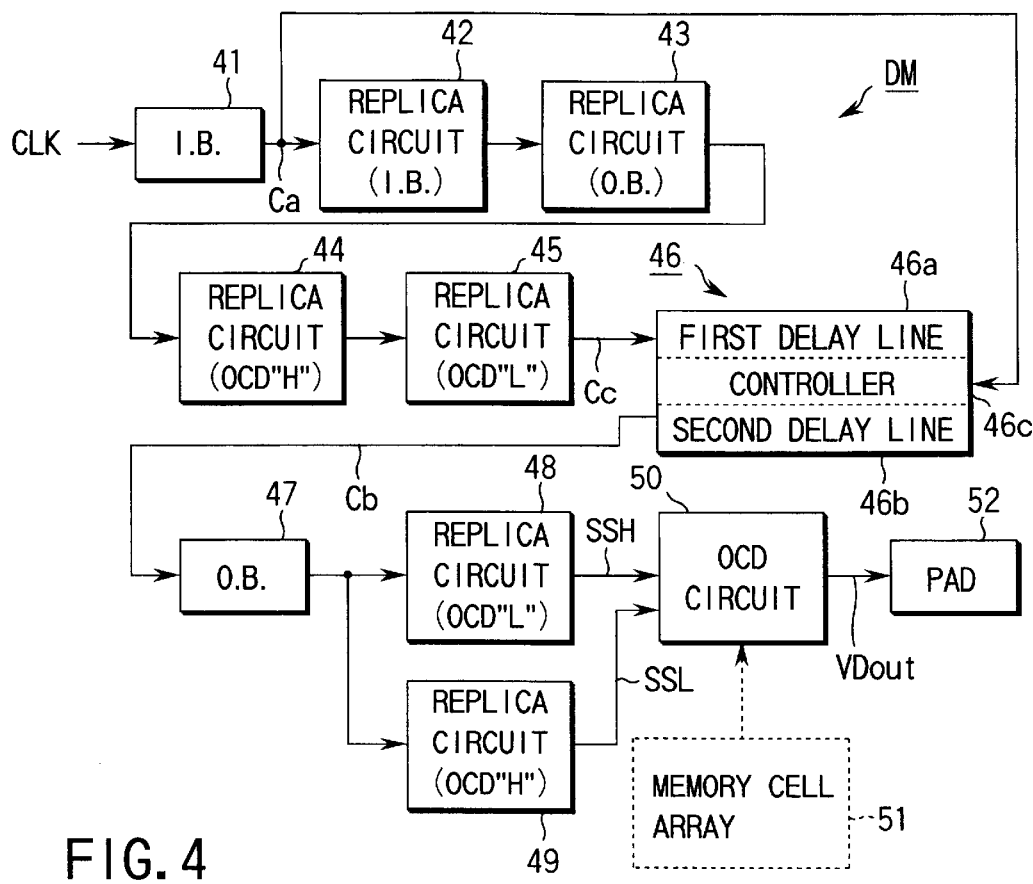
FIG. 4 is a configuration diagram showing a second embodiment of the present invention in which the present invention is applied to a mirror type delay locked loop.
Figure 5:
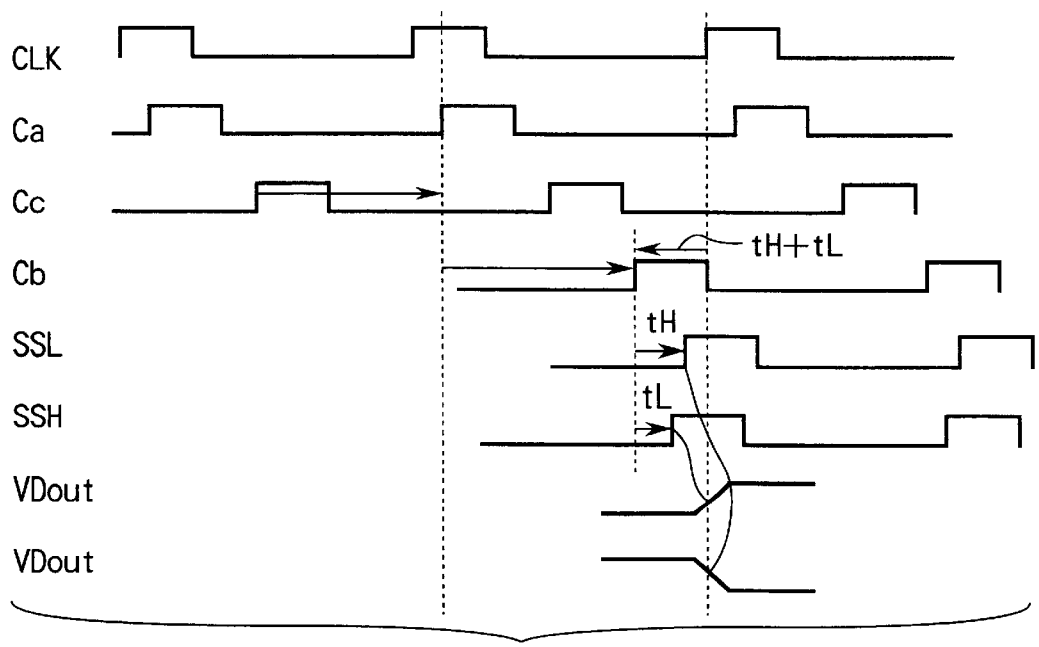
FIG. 5 is a time chart showing the operation of the configuration of FIG. 4.

FIGS. 4 and 5 show a second embodiment of the present invention. FIG. 4 shows the case where the present invention has been applied to a well known mirror-type DLL. A mirror-type DLL is disclosed in, for example, "A 1-ps Jitter 2 Clock Cycle Lock Time CMOS Digital Clock Generator Based on an Interleaved Synchronous Mirror Delay Scheme" ('97 Symposium on VLSI Circuits Digest of Technical Papers). FIG. 5 shows waveforms at various points of FIG. 4.

With reference to FIGS. 4 and 5, an external clock signal or an internal clock signal having the same period as that of an external clock signal CLK is supplied to an input buffer 41. A signal Ca delayed by a predetermined time and outputted from the input buffer is supplied to replica circuits 42, 43, 44 and 45. The replica circuit 42 is a circuit having the same delay time as that of the input buffer 41. The replica circuit 43 is a circuit having the same delay time as that of an output buffer 47. Furthermore, the replica circuit 44 has the same configuration as a circuit portion of an OCD circuit 50 described later through which high level data passes. The replica circuit 44 has the same delay time (tH) as a circuit portion of the OCD circuit 50 through which high level data passes. The replica circuit 45 has the same configuration as a circuit portion of the OCD circuit 50 through which low level data passes. The replica circuit 45 has the same delay time (tL) as a circuit portion of the OCD circuit 50 through which low level data passes.

An output signal Cc outputted from the replica circuit 45 is supplied to a variable delay line 46. The variable delay line 46 includes a first delay line 46a, a second delay line 46b, and a controller 46c. An output signal of the replica circuit 45 is supplied to an input terminal of the first delay line 46a. Each of the first delay line 46a and the second delay line 46b is formed of, for example, a plurality of unit delay elements which are not illustrated. The controller 46c controls the first delay line 46a and the second delay line 46b according to the output signal Ca of the input buffer 41. The signal Cc supplied to the first delay line 46a is delayed in the second delay line 46b by the same time as the time delayed by the first delay line 46a and outputted. In other words, the signal Cc supplied to the first delay line 46a is propagated through the first delay line 46a until the next pulse of the clock signal CLK is supplied to the controller 46c, and propagated through the second delay line 46b for the same duration as the duration of the propagation through the first delay line 46a. From the second variable delay line 46b, there is outputted a clock signal Cb synchronized to the clock signal CLK and advanced by a delay time (tH+tL+tO.B.) equivalent to the total of the delay time (tH) of the OCD circuit 50 outputting the high level data and the delay time (tL) of the OCD circuit 50 outputting the low level data, where tO.B. is a delay time of the output buffer 47. In FIG. 5, the delay time tO.B. of the output buffer 47 is omitted and not illustrated.

The output signal Cb of the second variable delay line 46b is supplied to the output buffer 47. An output signal of the output buffer 47 is supplied to a replica circuit 48 and a replica circuit 49. In the same way as the replica circuit, the replica circuit 48 has the same configuration as the circuit portion of the OCD circuit 50 described later through which high level data passes. The replica circuit 48 has the same delay time (tL+tO.B.) as the circuit portion of the OCD circuit 50 through which low level data passes. From the replica circuit 48, therefore, there is outputted a high level data output start signal SSH obtained by delaying an output signal of the second variable delay line 46a by the time (tL).

Furthermore, the replica circuit 49 has the same configuration as the circuit portion of the OCD circuit 50 described later through which high level data passes. The replica circuit 49 has the same delay time (tH+tO.B.) as the circuit portion of the OCD circuit 50 through which high level data passes. From the replica circuit 48, therefore, there is outputted a low level data output start signal SSL obtained by delaying an output signal of the second variable delay line 46a by the time (tH).

The high level data output start signal SSH outputted from the replica circuit 48, and the low level data output start signal SSL outputted from the replica circuit 49 are supplied to the OCD circuit 50. According to the start signals SSH and SSL, the OCD circuit 50 outputs data read from, for example, a memory cell array 51 to an output pad 52. In response to the high level data output start signal SSH outputted from the replica circuit 48, therefore, the OCD circuit 50 outputs high level data VDout. In response to the low level data output start signal SSL outputted from the replica circuit 49, the OCD circuit 50 outputs low level data VDout.

The replica circuits 48 and 49 are supplied with the output signal of one output buffer 47. However, the present embodiment is not restricted to this. For example, it is possible to connect two output buffers having the same delay time to the output terminal of the second delay line 46b in parallel and supply the output signal of the second delay line 46b to the replica circuits 48 and 49 via these output buffers, respectively.

In the second embodiment as well, an effect similar to that of the first embodiment can be obtained. In addition, jitter can be further reduced as compared with the DLL shown in the first embodiment by using the mirror type DLL.

With reference to the first and second embodiments, the case where the present invention is applied to control of the OCD circuit has been described. However, the present invention is not restricted to the control of the OCD circuit, but may be applied to such a circuit as to output high level/low level data in synchronism with the clock signal.

Third Embodiment

A third embodiment of the present invention will now be described. With reference to the first and second embodiments, the case where the present invention is applied to a circuit of a SDR (Single Data Rate) scheme has been described. On the other hand, the third embodiment shows the case where the present invention is applied to a circuit of a DDR (Double Data Rate) scheme.

In other words, in the DDR scheme, a circuit within a chip operates in synchronism with an external clock signal of, for example, 100 MHz. In response to the operation of this circuit, data is outputted at a data rate (for example, 200 MHz) which is twice the external clock signal. For example, between a memory cell array and a pad, a parallel-to-serial conversion circuit for converting 2-bit data to 1-bit data is needed.

Figure 6:
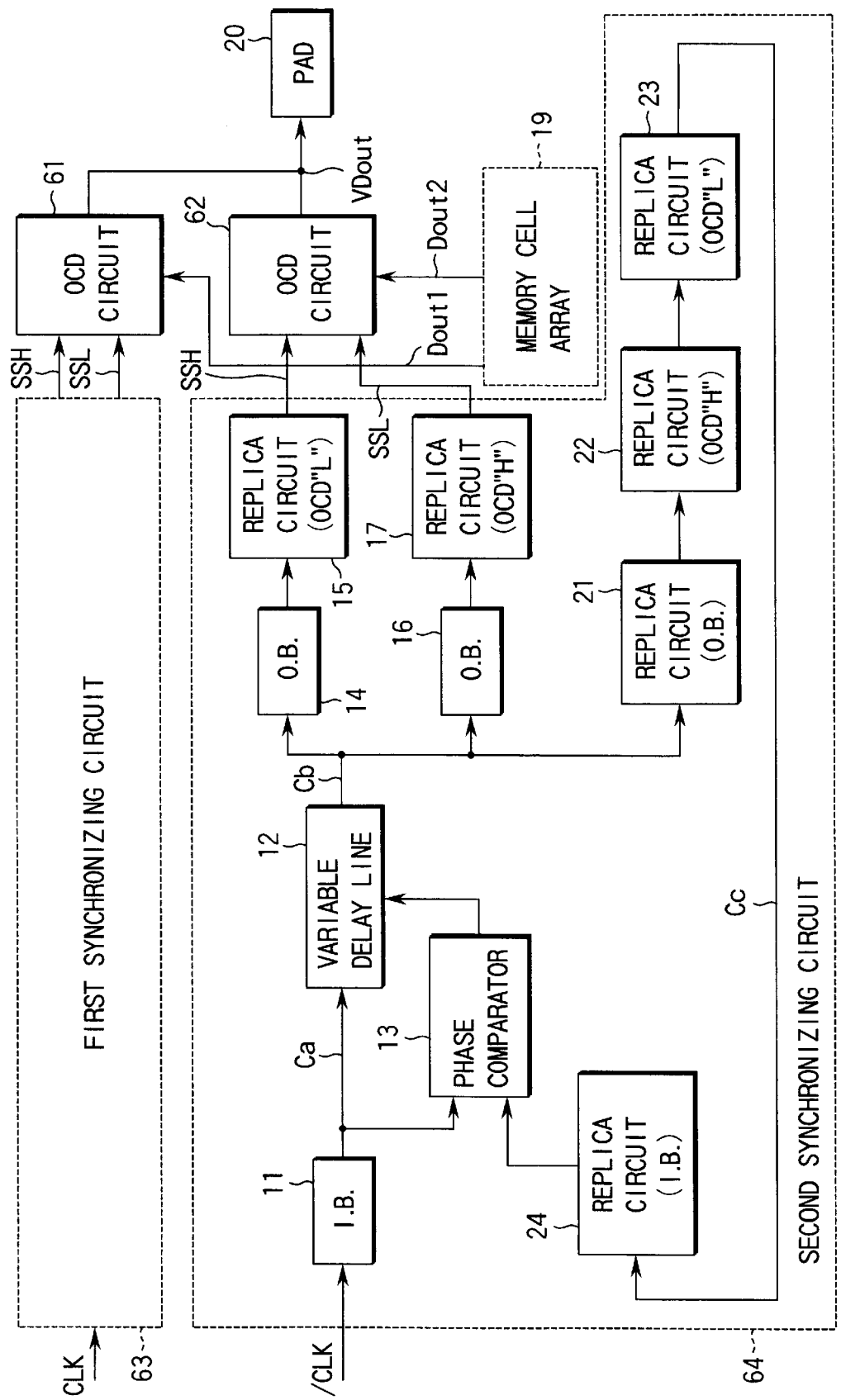
FIG. 6 is a configuration diagram showing a third embodiment of the present invention in which OCD circuits of two systems are provided.

FIG. 6 shows a scheme having OCD circuits of two systems. In FIG. 6, the same components as those of FIG. 2 are denoted by like numerals. Different components will now be described.

Data Dout1 and Dout2 outputted from a memory cell array 19 are supplied to input terminals of a first OCD circuit 61 and a second OCD circuit 62, respectively. A first synchronizing circuit 63 and a second synchronizing circuit 64 are connected to the first OCD circuit 61 and the second OCD circuit 62, respectively. From the first synchronizing circuit 63, the high level data output start signal SSH and the low level data output start signal SSL are supplied to the OCD circuit 61. From the second synchronizing circuit 64, the high level data output start signal SSH and the low level data output start signal SSL are supplied to the OCD circuit 62. Output terminals of the first and second OCD circuits 61 and 62 are connected to a pad 20. By the first and second OCD circuits 61 and 62, 2-bit data are converted 1-bit data and outputted to the pad 20. In other words, the first and second OCD circuits 61 and 62 form a parallel-to-serial conversion circuit.

FIG. 7 shows an example of the first and second OCD circuits 61 and 62. Since the first and second OCD circuits 61 and 62 have the same configuration, only the configuration of the first OCD circuits 61 will now be described. In the second OCD circuit 62, the same components as those of the first OCD circuit 61 are denoted by adding the same subscripts to numeral 62, and description thereof will be omitted.

In the first OCD circuit 61, data Dout1 supplied from the memory cell array 19 is supplied to an input terminal of a tri-state buffer circuit 61d via inverter circuits 61a, 61b and 61c. An output terminal of the tri-state buffer circuit 61d is connected to the pad 20. An output signal of the inverter circuit 61c is supplied to a first input terminal of an AND circuit 61f via an inverter circuit 61e, and supplied directly to a first input terminal of an AND circuit 61g. The high level data output start signal SSH and the low level data output start signal SSL are supplied to second terminals of the AND circuits 61f and 61g, respectively. Output signals of the AND circuits 61f and 61g are supplied to an OR circuit 61h. An output signal C1 of the OR circuit 61h is supplied to the tri-state buffer circuit 61d as a control signal.

FIG. 8A shows an example of the tri-state buffer circuit 61d. An output signal of the inverter circuit 61c (denoted by Dout1) is supplied to first input terminals of a NAND circuit 81 and a NOR circuit 82. An output signal C1 of the OR circuit 61h is supplied to a second input terminal of the NOR circuit 82, and supplied to a second input terminal of the NAND circuit 81 via an inverter circuit 83. Between power supply VDD and ground, a P-channel MOS transistor 84 and an N-channel MOS transistor 85 are connected in series. An output signal of the NAND circuit 81 is supplied to the transistor 84 at its gate. An output signal of the NOR circuit 82 is supplied to the transistor 85 at its gate. From a connection node N1 of the transistors 84 and 85, an output signal of the tri-state buffer circuit 61*d* is outputted. The configuration of the tri-state buffer circuit is not restricted to FIG. 8A, but a tri-state buffer circuit can be used. FIG. 8B shows level relations among the data Dout1, the control signal C1, and the connection node of the tri-state buffer circuit 61*d*.

Each of the first and second synchronizing circuits 63 and 64 shown in FIG. 6 has the same configuration as the circuit shown in FIG. 2. However, each of the replica circuits (OCD circuit "L") 15 and 23 for generating the high level data output start signal SSH in the first and second synchronizing circuits 63 and 64 is a circuit having the same delay time as that of a circuit of a path for bringing the pad 20 into a low level when the data Dout1 (Dout2) is at a low level and the signal C1 (C2) is at a high level in the first and second OCD circuits 61 and 62. Furthermore, each of the replica circuits (OCD circuit "H") 17 and 22 for generating the low level data output start signal SSL is a circuit having the same delay time as that of a circuit of a path for bringing the pad 20 into a high level when the data Dout1 (Dout2) is at a high level and the signal C1 (C2) is at a high level.

The first synchronizing circuit 63 is supplied with an external clock signal CLK or a difference between the external clock signal CLK and an inverted external clock signal /CLK. The second synchronizing circuit 64 is supplied with the inverted signal /CLK of the external clock signal CLK or a difference between the inverted clock signal /CLK and the external clock signal CLK. Therefore, the first and second synchronizing circuits 63 and 64 operate at timing phases with a shift equivalent to half a period of the external clock signal CLK between.

Figure 9:
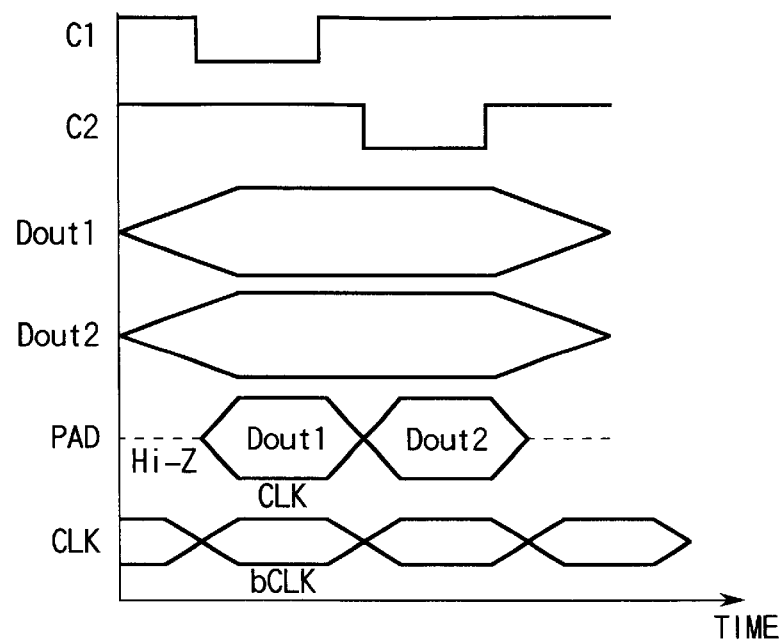
FIG. 9 is a time chart showing the operation of the configuration of FIG. 6.

FIG. 9 shows the operation of the circuits shown in FIGS. 6, 7 and 8A. On the basis of the data Dout1, the high level data output start signal SSH, and the low level data output start signal SSL, the first OCD circuit 61 generates the control signal C1 shown in FIG. 9. This control signal C1 is supplied to the tri-state buffer circuit 61*d*. On the basis of the data Dout2, the high level data output start signal SSH, and the low level data output start signal SSL, the second OCD circuit 62 generates the control signal C2. This control signal C2 is supplied to the tri-state buffer circuit 62*d*. The tri-state buffer circuits 61*d* and 62*d* of the first and second OCD circuits 61 and 62 successively output data Dout1 and Dout2 read out from the memory cell array 19 in response to the control signals C1 and C2. In one cycle of the external clock signal CLK, therefore, the data Dout1 and Dout2 can be outputted to the pad 20.

In the above described third embodiment, the first and second OCD circuits 61 and 62 for receiving the output data Dout1 and Dout2 of the memory cell array 19 are provided. The first and second OCD circuits 61 and 62 have tri-state buffer circuits 61*d* and 62*d*, respectively. The tri-state buffer circuits 61*d* and 62*d* are controlled respectively by the control signals C1 and C2 generated on the basis of the high level data output start signal SSH and the low level data output start signal SSL supplied from the first and second synchronizing circuits 63 and 64. In the DDR, therefore, data can be outputted from the first and second OCD circuits 61 and 62 in synchronism with the external clock signal CLK. In addition, the data rising edges and falling edges can be aligned. In addition, since one synchronizing circuit needs only be provided for each OCD circuit, the area occupied by the synchronizing circuit can be prevented from increasing and the power consumption can be reduced in the DDR.

Fourth Embodiment

Figure 10:
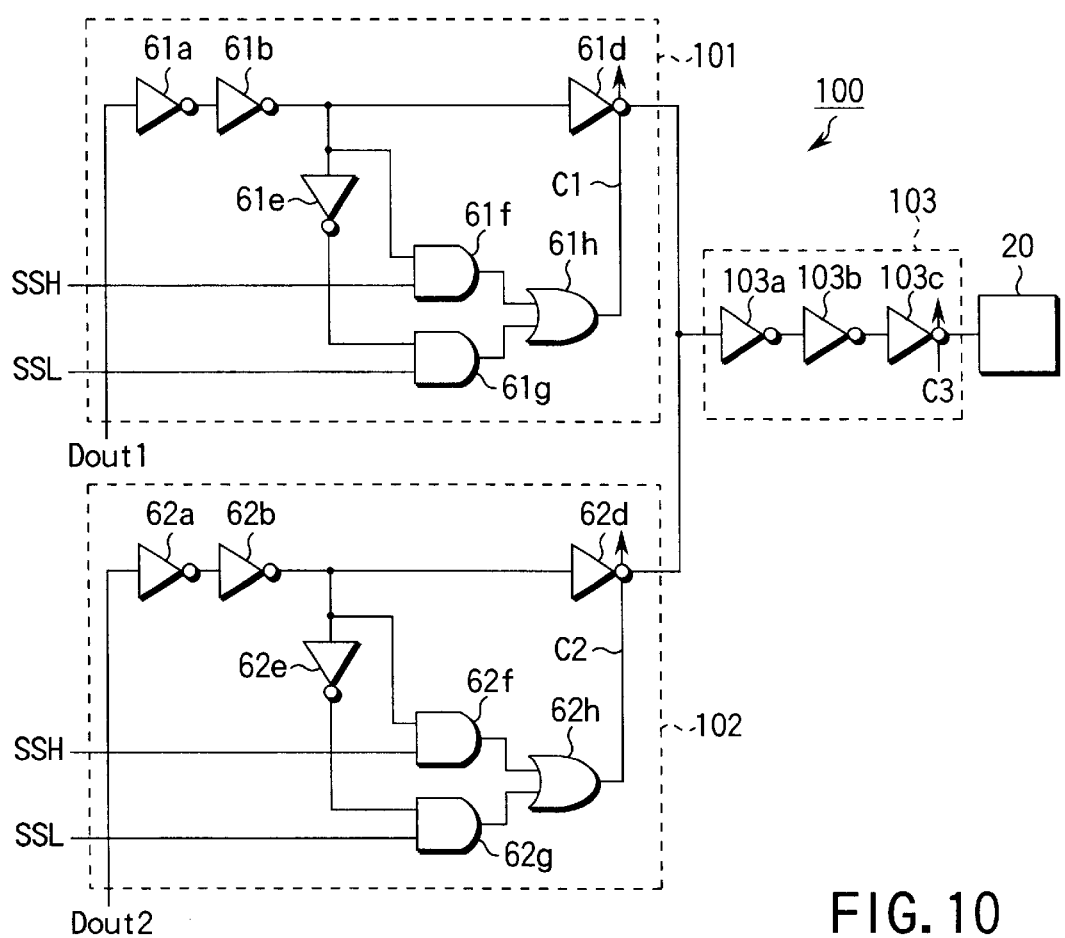
FIG. 10 is a circuit diagram showing a fourth embodiment of the present invention.

FIG. 10 shows a fourth embodiment of the present invention. In the third embodiment, the tri-state buffer circuits 61*d* and 62*d* respectively of the first and second OCD circuits 61 and 62 conduct parallel-to-serial conversion of data and drive a pad 20.

On the other hand, in the fourth embodiment shown in FIG. 10, first and second buffer circuits 101 and 102 forming a parallel-to-serial conversion circuit 100 respectively conduct parallel-to-serial conversion of data Dout1 and Dout2, and supply output signals of the first and second buffer circuits 101 and 102 to an OCD circuit 103. This OCD circuit drives the pad 20.

The first and second buffer circuits 101 and 102 have nearly the same configuration as that of the first and second OCD circuits 61 and 62 in the third embodiment. That is, in FIG. 10, the inverter circuits 61*c* and 62C shown in FIG. 7 are omitted. An output signal of the inverter circuit 61*b* is supplied to the first input terminal of the AND circuit 61*g* via the inverter circuit 61*e*, and supplied directly to the first input terminal of the AND circuit 61*f*. An output signal of the inverter circuit 62*b* is supplied to the first input terminal of the AND circuit 62*g* via the inverter circuit 62*e*, and supplied directly to the first input terminal of the AND circuit 62*f*. The same components as those of the first and second OCD circuits 61 and 62 are denoted by like numerals and description thereof will be omitted.

Furthermore, the OCD circuit 103 is formed of inverter circuits 103*a* and 103*b* and a tri-state buffer circuit 103*c* connected in series. The tri-state buffer circuit 103*c* is similar to, for example, the circuit shown in FIG. 8A. The tri-state buffer circuit 103*c* is supplied with a control signal C3. This control signal C3 cancels the high impedance state of the tri-state buffer circuit 103*c* when outputting parallel-to-serial converted data. The control signal C3 is synchronized to the external clock signal CLK.

Furthermore, a replica circuit of the OCD circuit 103 is formed of a circuit having the same delay time as that of the path between output terminals of the tri-state buffer circuits 61*d* and 62*d* and the pad 20. In other words, each of the replica circuits (OCD circuit "L") 15 and 23 for generating the high level data output start signal SSH is a circuit having the same delay time as that of a circuit of a path for bringing the pad 20 into a high level when the data Dout1 (Dout2) is at a high level and the signal C1 (C2) is at a high level. Furthermore, each of the replica circuits (OCD circuit "H") 17 and 22 for generating the low level data output start signal SSL is a circuit having the same delay time as that of a circuit of a path for bringing the pad 20 into a low level when the data Dout1 (Dout2) is at a low level and the signal C1 (C2) is at a high level.

Figure 11:
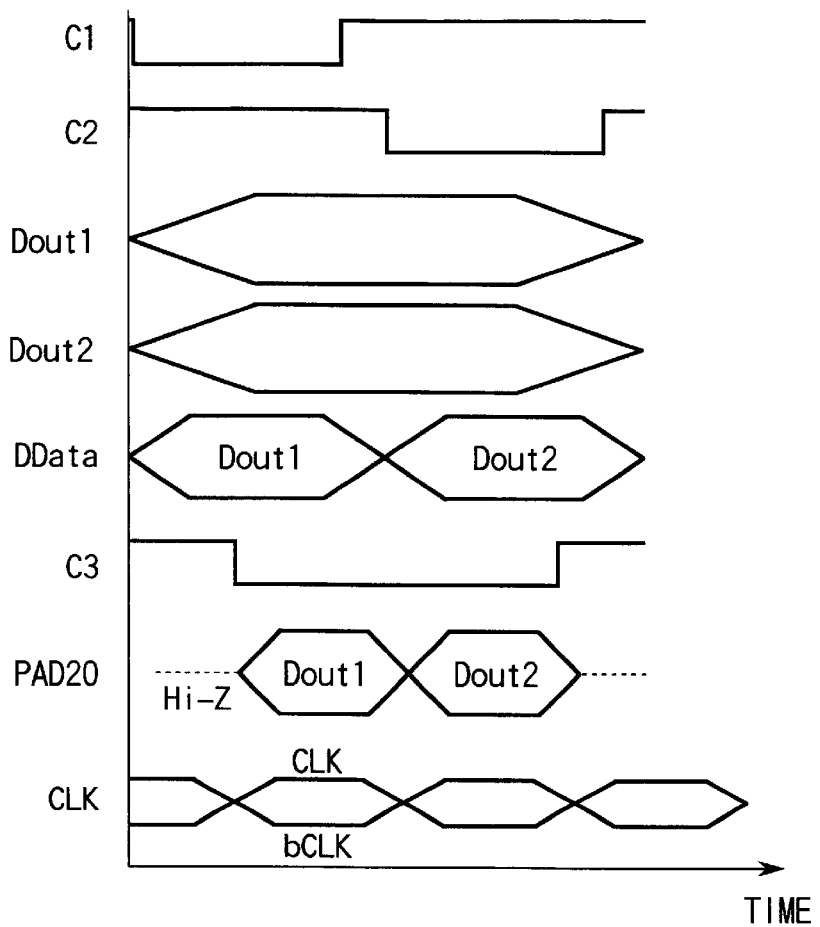
FIG. 11 is a time chart showing the operation of the circuit shown in FIG. 10.

FIG. 11 shows the operation of the circuit shown in FIG. 10. On the basis of the data Dout1, the high level data output start signal SSH, and the low level data output start signal SSL, the first buffer circuit 101 generates the control signal C1 as shown in FIG. 10. This control signal C1 is supplied to the tri-state buffer circuit 61*d*. On the basis of the data Dout2, the high level data output start signal SSH, and the low level data output start signal SSL, the second buffer circuit 102 generates the control signal C2 as shown in FIG. 10. This control signal C2 is supplied to the tri-state buffer circuit 62*d*. The tri-state buffer circuits 61*d* and 62*d* of the first and second buffer circuits 101 and 102 successively output data Dout1 and Dout2 read out from the memory cell array 19 in response to the control signals C1 and C2.

In the OCD circuit 103, the high impedance state of the tri-state buffer circuit 103*c* is canceled according to the control signal C3 synchronized to the external clock signal CLK. In this state, the tri-state buffer circuit 103*c* drives the pad 20 according to the data Dout1 and Dout2 supplied via the inverter circuits 103a and 103b. In one cycle of the external clock signal CLK, therefore, the data Dout1 and Dout2 can be outputted to the pad 20.

In the above described fourth embodiment, data outputted from the parallel-to-serial conversion circuit 100 can be outputted in synchronism with the external clock signal CLK. In addition, the data rising edges and falling edges can be aligned.

In addition, the output signals of the first and second buffer circuits 101 and 102 are supplied to the OCD circuit 103, and the pad 20 is driven by the OCD circuit 103. Therefore, only the size and drive capability of a transistor forming the tri-state buffer circuit 103c driving the pad 20 need only be made great. In other words, transistors forming the tri-state buffer circuits 61d and 62d which need not drive the pad 20 may be made smaller in size than the transistor of the tri-state buffer circuit 103c. Therefore, the fourth embodiment can be simplified in circuit configuration as compared with the third embodiment.

Fifth Embodiment

Figure 12:
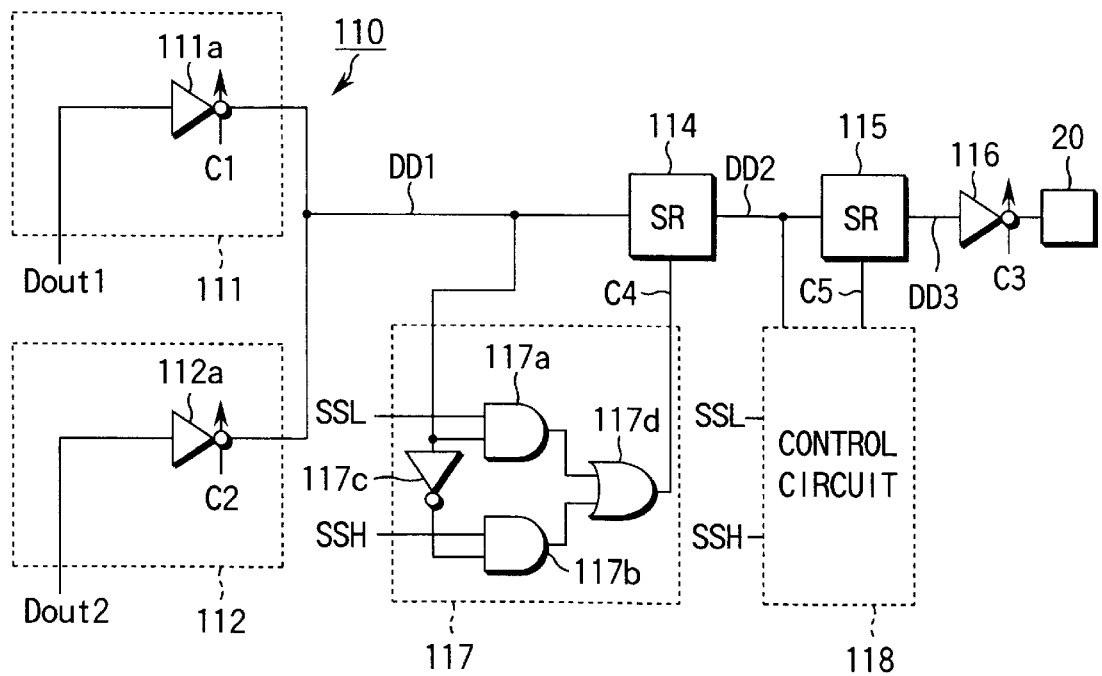
FIG. 12 is a circuit diagram showing a fifth embodiment of the present invention.

FIG. 12 shows a fifth embodiment of the present invention. In a synchronous DRAM, for example, a shift register is used in a path after the parallel-to-serial conversion in some cases in order to, for example, count clocks since a command decoder receives a read command until data is actually outputted. As in this case, a shift register is provided between the parallel-to-serial conversion circuit and the pad, in the fifth embodiment.

In FIG. 12, first and second buffer circuits 111 and 112 forming a parallel-to-serial conversion circuit 110 are formed of tri-state buffer circuits 111a and 112a respectively. The tri-state buffer circuit 111a is supplied with data Dout1 outputted from a memory cell array 19. The tri-state buffer circuit 112a is supplied with data Dout2 outputted from the memory cell array 19. The tri-state buffer circuit 111a is controlled by a control signal C1. The tri-state buffer circuit 112a is controlled by a control signal C2. The control signals C1 and C2 are signals synchronized to an external clock signal CLK. The control signals C1 and C2 are supplied to the tri-state buffer circuits 111a and 112a alternately.

Between output terminals of the tri-state buffer circuits 111a and 112a and the pad 20, shift registers 114 and 115 and a tri-state buffer circuit 116 serving as an OCD circuit are connected in series. When outputting data, the tri-state buffer circuit 116 is supplied with a control signal C3 for canceling its high impedance state. The control signal C3 is similar to that of the fourth embodiment.

Control circuits 117 and 118 are connected to the shift registers 114 and 115, respectively. Since the control circuits 117 and 118 have the same configuration, only the control circuit 117 will now be described.

In the control circuit 117, first input terminals of AND circuits 117b and 117a are supplied with a high level data output start signal SSH and a low level data output start signal SSL, respectively. Circuits for generating the high level data output start signal SSH and the low level data output start signal SSL are similar to those shown in FIG. 2 or 6. As described later, however, the circuits for generating the high level data output start signal SSH and the low level data output start signal SSL are different from those shown in FIG. 2 or 6 in configuration of replica circuits.

A second input terminal of the AND circuit 117a is supplied with an input signal of the shift register 114. A second input terminal of the AND circuit 117b is supplied with the input signal of the shift register 114 via an inverter circuit 117c. Output signals of the AND circuits 117a and 117b are supplied to input terminals of an OR circuit 117d, respectively. A control signal C4 outputted from an output terminal of the OR is supplied to the shift register 114.

A control signal C5 outputted from the control circuit 118 is supplied to the shift register 115. Each of the control signals C4 and C5 has a period equivalent to twice that of the external clock signal CLK.

Figure 13:
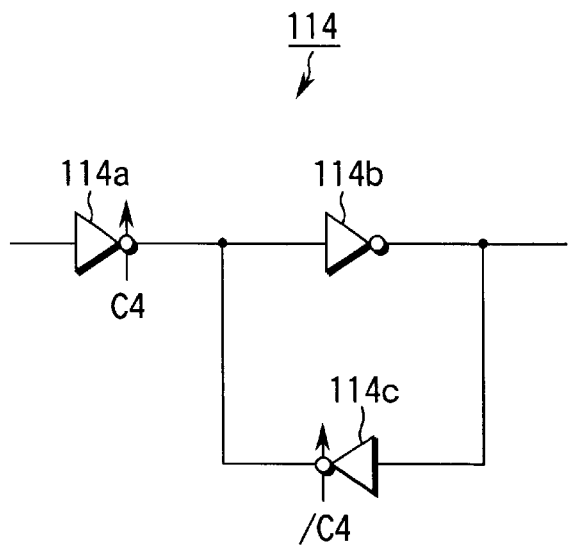
FIG. 13 is a circuit diagram showing an example of a shift register illustrated in FIG. 12.
Figure 15:
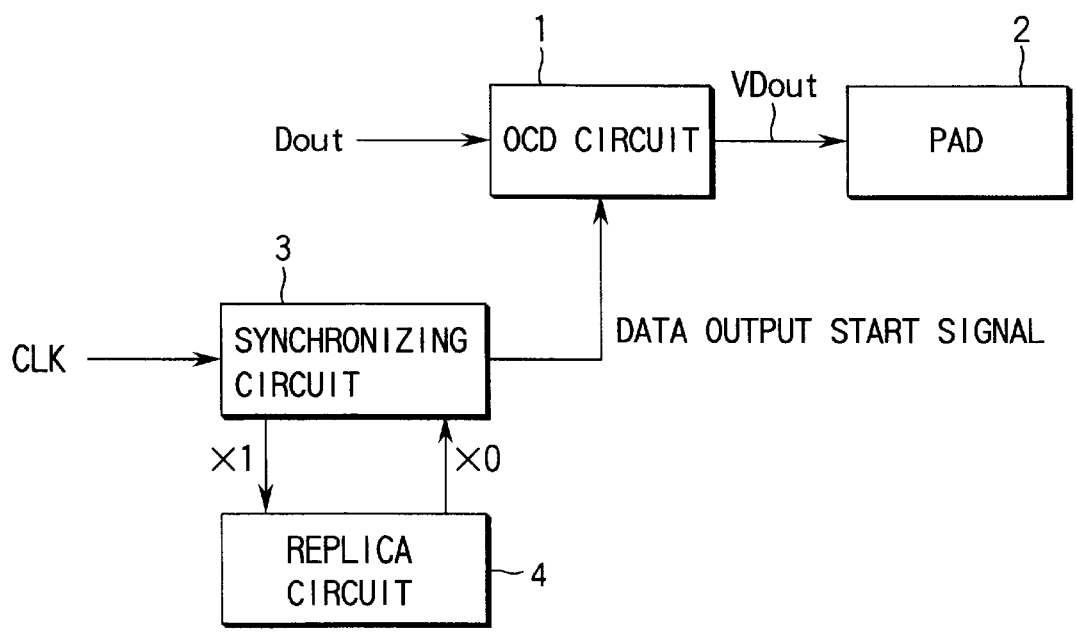
FIG. 15 is a configuration diagram showing a conventional synchronizing circuit.

FIG. 13 shows an example of the shift register 114. The shift register 115 also has a configuration similar to that of the circuit shown in FIG. 13. The shift register includes a clocked inverted circuit 114a an inverter circuit 114b, and a clocked inverted circuit 114c. The inverter circuit 114b and the clocked inverted circuit 114c form a latch circuit. The clocked inverted circuit 114a is supplied with the control signal C4. The clocked inverted circuit 114c is supplied with an inverted control signal /C4.

In the circuit shown in FIG. 12, the shift register 115 and a subsequent circuit form a critical path. Therefore, replica circuits are formed of circuits having the same delay time as that of a path between the shift register 115 and the pad 20. In other words, each of the replica circuits (OCD circuit "L") 15 and 23 for generating the high level data output start signal SSH shown in FIG. 2 is a circuit having the same delay time as that of a circuit of a path for bringing the pad 20 into a low level when output data DD2 of the shift register 114 is at a low level and the low level data output start signal SSL is at a high level. Furthermore, each of the replica circuits (OCD circuit "H") 17 and 22 for generating the low level data output start signal SSL is a circuit having the same delay time as that of a circuit of a path for bringing the pad 20 into a high level when the output data DD2 of the shift register 114 is at a high level and the high level data output start signal SSH is at a high level.

Figure 14:
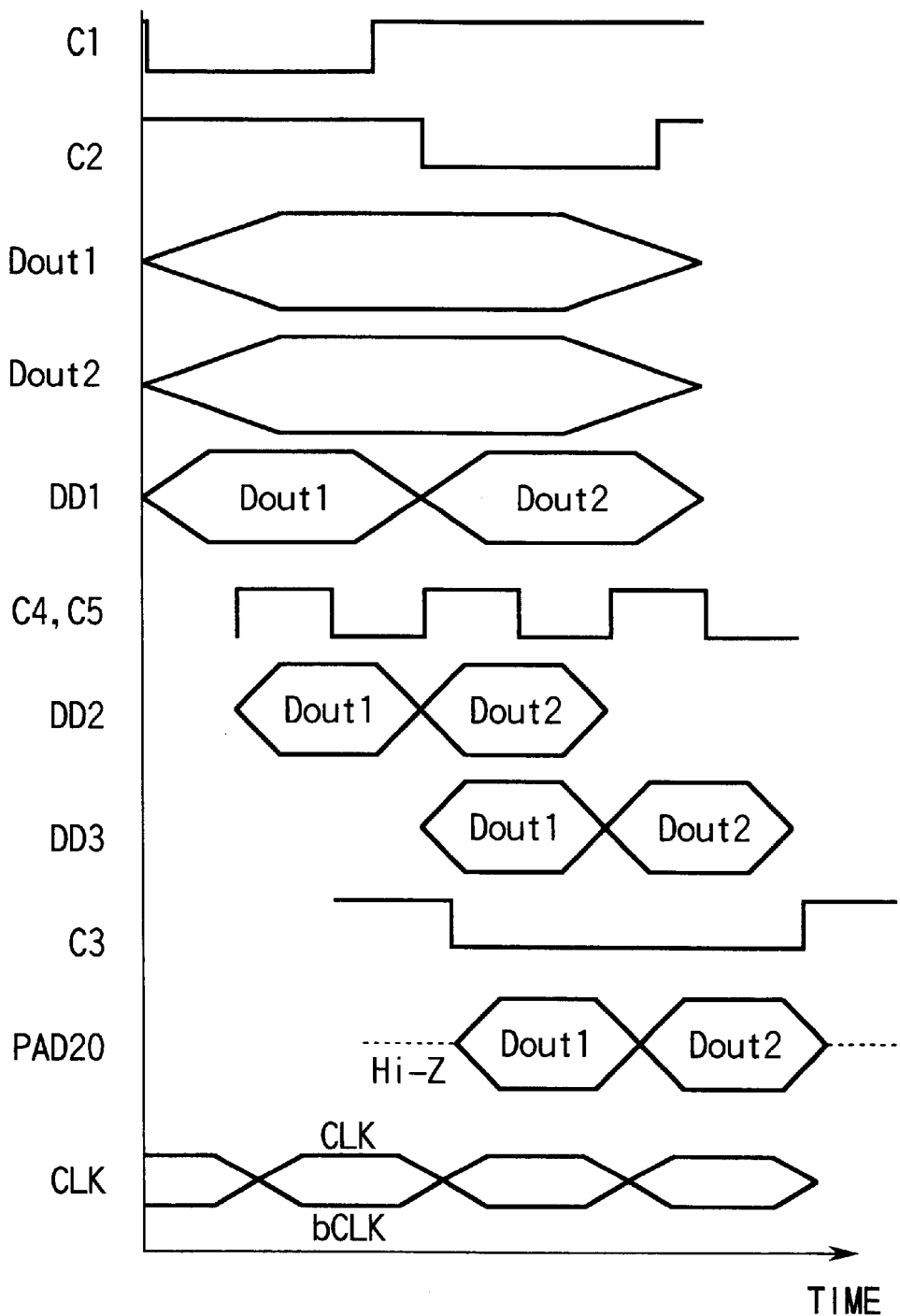
FIG. 14 is a time chart showing the operation of the circuit shown in FIG. 12.
Figure 16:
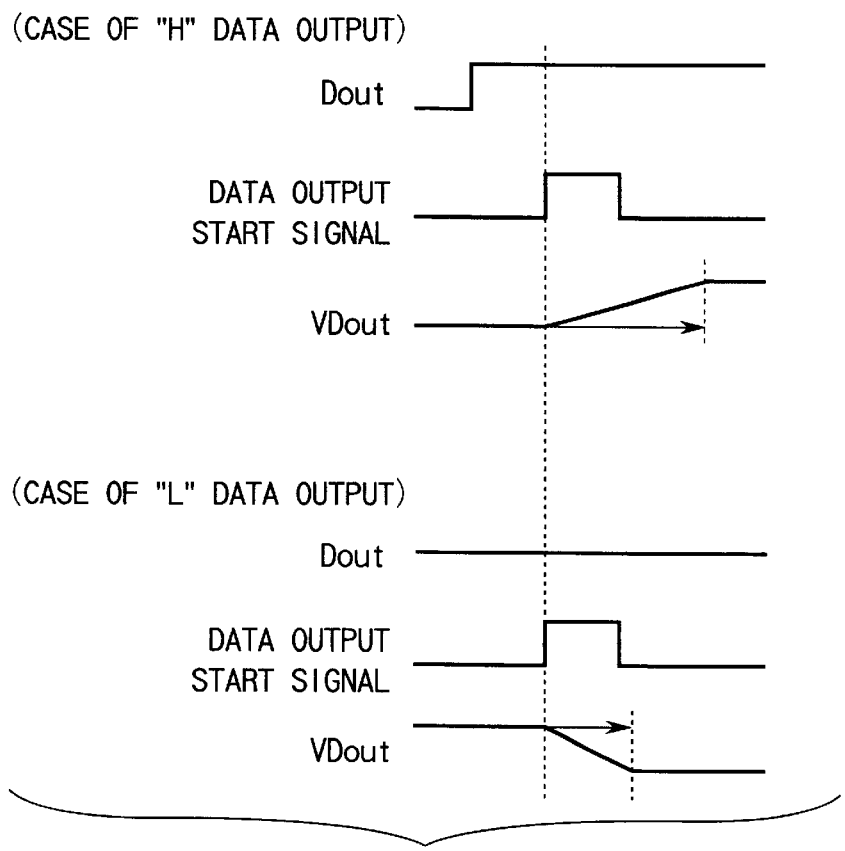
FIG. 16 is a time chart showing the operation of the circuit shown in FIG. 15.
Figure 17:
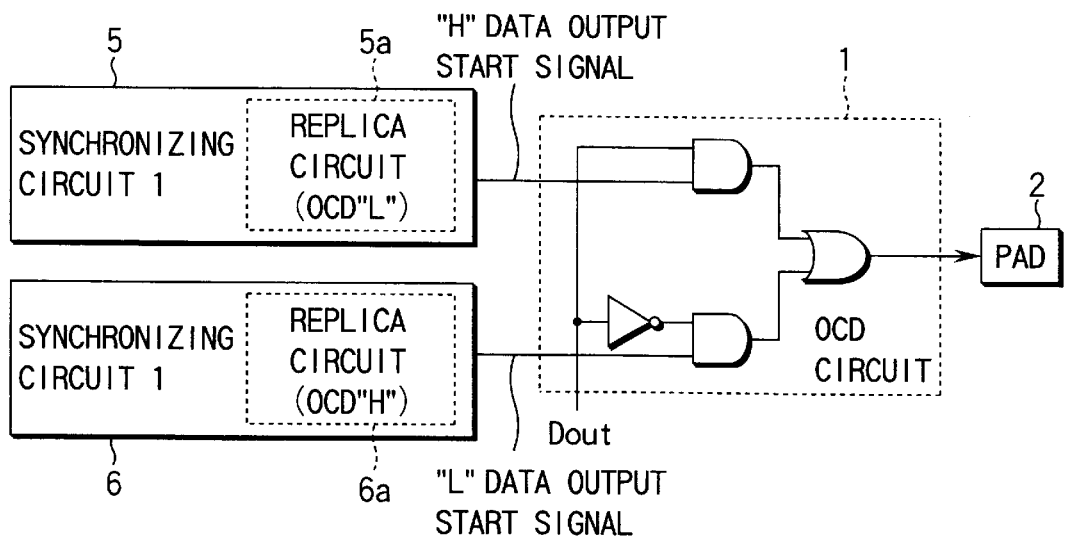
FIG. 17 is a configuration diagram showing another example of a conventional synchronizing circuit.

FIG. 14 shows the operation of the circuit shown in FIG. 12. The tri-state buffer circuits 111a and 112a of the first and second buffer circuits 111 and 112 successively output data Dout1 and Dout2 read out from the memory cell array 19 in response to the control signals C1 and C2.

The control circuit 117 outputs the control signal C4 having a period equivalent to twice that of the external clock signal CLK on the basis of the data DD1 outputted from the first and second buffer circuits 111 and 112, the high level data output start signal SSH, and the low level data output start signal SSL. In response to the control signal C4, the shift register 114 takes in the data DD1 outputted from the first and second buffer circuits 111 and 112, and successively outputs it as data DD2.

The control circuit 118 outputs the control signal C5 having a period equivalent to twice that of the external clock signal CLK on the basis of the data DD2 outputted from the shift register 114, the high level data output start signal SSH, and the low level data output start signal SSL. In response to the control signal C5, the shift register 115 takes in the data DD2 outputted from the shift register 114, and successively the shift register 115 is supplied to the tri-state buffer circuit 116. The tri-state buffer circuit 116 outputs data DD3 to the pad 20 in response to the control signal C3.

In the fifth embodiment, the control signals C4 and C5 for controlling the shift registers 114 and 115 are generated on the basis of the high level data output start signal SSH and the low level data output start signal SSL. In a circuit of the DDR scheme having the shift registers 114 and 115 in a path of output data, the data rising edges and falling edges can be aligned.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A synchronizing circuit comprising:

an output circuit for outputting high level data and low level data, said output circuit having a first circuit for outputting said high level data in response to a first start signal having a period equal to a period of a clock signal and a second circuit for outputting said low level data in response to a second start signal having a period equal to the period of said clock signal;

a first signal generation circuit supplied with said clock signal, said first signal generation circuit advancing a phase of said clock signal substantially by a total of a first delay time caused when said first circuit outputs high level data and a second delay time caused when said second circuit outputs low level data;

a second signal generation circuit having a delay time substantially equal to said second delay time of said second circuit, said second signal generation circuit delaying a signal outputted from said first signal generation circuit, and generating said first start signal for starting said first circuit of said output circuit by using the delayed signal; and a third signal generation circuit having a delay time substantially equal to said first delay time of said first circuit, said third signal generation circuit delaying a signal outputted from said first signal generation circuit, and generating said second start signal for starting said second circuit of said output circuit by using the delayed signal.

2. The circuit according to claim 1, wherein said first signal generation circuit comprises a delay locked loop.

3. The circuit according to claim 1, wherein said first signal generation circuit comprises:

an input buffer supplied with said clock signal;

a delay line for delaying an output signal of said input buffer;

a replica circuit for delaying an output signal of said delay line, said replica circuit having a delay time equal to a total delay time of said second and third signal generation circuits and said input buffer; and a phase comparator supplied with the output signal of said input buffer and an output signal of said replica circuit, said phase comparator detecting a phase difference between the output signal of said input buffer and the output signal of said replica circuit and controlling said delay line according to the detected phase difference.

4. The circuit according to claim 1, wherein said first signal generation circuit comprises a mirror-type delay locked loop.

5. The circuit according to claim 4, wherein said first signal generation circuit comprises:

an input buffer supplied with said clock signal;

a delay monitor supplied with an output signal of said input buffer, said delay monitor monitoring delay values of said input buffer and an output buffer;

a first delay line supplied with an output signal of said delay monitor, said first delay line delaying the output signal of said delay monitor by one period of a clock signal outputted from said input buffer; and a second delay line for delaying a signal delayed by said first delay line by a time substantially equal to the delay time caused by said first delay line.

6. The circuit according to claim 3, wherein said first signal generation circuit comprises a series circuit of said first circuit for outputting high level data, and the second circuit for outputting low level data.

7. A synchronizing circuit comprising:

an input buffer supplied with a clock signal;

a first delay circuit supplied with an output signal of said input buffer, said first delay circuit being varied in delay time;

a first output buffer supplied with an output signal of said first delay circuit;

a second output buffer supplied with the output signal of said first delay circuit;

a first replica circuit supplied with an output signal of said first buffer, said first replica circuit having same configuration as that of a circuit portion of an output circuit for outputting a high level signal;

a second replica circuit supplied with an output signal of said second buffer, said second replica circuit having same configuration as that of a circuit portion of an output circuit for outputting a low level signal;

an output circuit supplied with output signals of said first and second replica circuits, said output circuit outputting data supplied from a memory cell in response to output signals of said first and second replica circuits;

a second delay circuit supplied with the output signal of said first delay circuit, said second delay circuit having a third replica circuit comprising a replica circuit for said first and second output buffers and a fourth replica circuit said first and second replica circuits;

a fifth replica circuit supplied with an output signal of said second delay circuit, said fifth replica circuit having same configuration as that of said input buffer; and a phase comparator for comparing a phase of an output signal of said fifth replica circuit with a phase of the output signal of said input buffer, said phase comparator controlling said first delay circuit in response to a phase difference between the output signal of said fifth replica circuit and the output signal of said input buffer.

8. The circuit according to claim 7, wherein said output circuit comprises:

a first logic circuit supplied with an input signal at a first input terminal thereof and supplied with an output signal of said first replica circuit at a second input terminal thereof;

a second logic circuit supplied with an inverted signal of said input signal at a first input terminal thereof and supplied with an output signal of said second replica circuit at a second input terminal thereof; and a third logic circuit supplied with output signals of said first and second logic circuits at first and second input terminals thereof, respectively.

9. A synchronizing circuit comprising:

a first output circuit supplied with first data outputted from a memory cell array, said first output circuit outputting the first data, said first output circuit having a first circuit for outputting high level data in response to a first start signal having a period equal to a period of a clock signal and a second circuit for outputting low level data in response to a second start signal having a period equal to the period of said clock signal;

a second output circuit supplied with second data outputted from said memory cell array, said second output circuit outputting the second data, said second output circuit having a third circuit for outputting high level data in response to a third start signal having a period equal to a period of said clock signal and a fourth circuit for outputting low level data in response to a fourth start signal having a period equal to the period of said clock signal;

a first synchronizing circuit for generating said first and second start signals in response to said clock signal; and a second synchronizing circuit for generating said third and fourth start signals in response to an inverted signal of said clock signal.

10. The circuit according to claim 9, wherein said first synchronizing circuit comprises:

a first signal generation circuit supplied with said clock signal, said first signal generation circuit advancing a phase of said clock signal substantially by a total of a first delay time caused when said first circuit outputs high level data and a second delay time caused when said second circuit outputs low level data;

a second signal generation circuit having a delay time substantially equal to said second delay time of said second circuit, said second signal generation circuit delaying a signal outputted from said first signal generation circuit, and generating said first start signal for starting said first circuit of said first output circuit by using the delayed signal; and a third signal generation circuit having a delay time substantially equal to said first delay time of said first circuit, said third signal generation circuit delaying a signal outputted from said first signal generation circuit, and generating said second start signal for starting said second circuit of said first output circuit by using the delayed signal.

11. The circuit according to claim 9, wherein said second synchronizing circuit comprises:

a fourth signal generation circuit supplied with said clock signal, said fourth signal generation circuit advancing a phase of said clock signal substantially by a total of a third delay time caused when said third circuit outputs high level data and a fourth delay time caused when said fourth circuit outputs low level data;

a fifth signal generation circuit having a delay time substantially equal to said fourth delay time of said fourth circuit, said fifth signal generation circuit delaying a signal outputted from said fourth signal generation circuit, and generating said third start signal for starting said third circuit of said second output circuit by using the delayed signal; and a sixth signal generation circuit having a delay time substantially equal to said third delay time of said third circuit, said sixth signal generation circuit delaying a signal outputted from said fourth signal generation circuit, and generating said fourth start signal for starting said fourth circuit of said second output circuit by using the delayed signal.

12. The circuit according to claim 10, wherein said first output circuit comprises:

a first tri-state buffer circuit supplied with first data read out from said memory cell array; and a first control signal generation circuit supplied with said first data, said first start signal, and said second start signal, said first control signal generation circuit generating a first control signal for controlling said first tri-state buffer circuit in response to said first data, said first start signal, and said second start signal.

13. The circuit according to claim 11, wherein said second output circuit comprises:

a second tri-state buffer circuit supplied with second data read out from said memory cell array; and a second control signal generation circuit supplied with said second data, said third start signal, and said fourth start signal, said second control signal generation circuit generating a second control signal for controlling said second tri-state buffer circuit in response to said second data, said third start signal, and said fourth start signal.

14. A synchronizing circuit comprising:

a first buffer circuit supplied with first data outputted from a memory cell array, said first buffer circuit outputting the first data, said first buffer circuit having a first circuit for outputting high level data in response to a first start signal having a period equal to a period of a clock signal and a second circuit for outputting low level data in response to a second start signal having a period equal to the period of said clock signal;

a second buffer circuit supplied with second data outputted from said memory cell array, said second buffer circuit outputting the second data, said second buffer circuit having a third circuit for outputting high level data in response to a third start signal having a period equal to a period of said clock signal and a fourth circuit for outputting low level data in response to a fourth start signal having a period equal to the period of said clock signal;

an output circuit supplied with output signals of said first and second buffer circuits;

a first synchronizing circuit for generating said first and second start signals in response to said clock signal; and a second synchronizing circuit for generating said third and fourth start signals in response to an inverted signal of said clock signal.

15. The circuit according to claim 14, wherein said first buffer circuit comprises:

a first tri-state buffer circuit supplied with first data read out from said memory cell array; and a first control signal generation circuit supplied with said first data, said first start signal, and said second start signal, said first control signal generation circuit generating a first control signal for controlling said first tri-state buffer circuit in response to said first data, said first start signal, and said second start signal.

16. The circuit according to claim 14, wherein said second buffer circuit comprises:

a second tri-state buffer circuit supplied with second data read out from said memory cell array; and a second control signal generation circuit supplied with said second data, said third start signal, and said fourth start signal, said second control signal generation circuit generating a second control signal for controlling said second tri-state buffer circuit in response to said second data, said third start signal, and said fourth start signal.

17. The circuit according to claim 16, wherein said output circuit comprises a third tri-state buffer circuit, and a size of each of transistors included in said first and second tri-state buffer circuits is set so as to be smaller than a size of a transistor included in said third tri-state buffer circuit.

18. A synchronizing circuit comprising:
- a parallel-to-serial conversion circuit supplied with first and second data outputted from a memory cell array, said parallel-to-serial conversion circuit successively outputting said first and second data;
- a shift register supplied with an output signal of said parallel-to-serial conversion circuit, said shift register having a first circuit for outputting high level data and a second circuit for outputting low level data;
- an output circuit supplied with an output signal of said shift register;
- a control circuit connected to said shift register, said control circuit generating a control signal in response to the output signal of said parallel-to-serial conversion circuit, a first start signal for outputting high level data, and a second start signal for outputting low level data, each of said first and second start signals having a period equal to a period of said clock signal, said control signal being supplied to said shift register; and
- a start signal generation circuit for generating said first and second start signals in response to said clock signal.

19. The circuit according to claim 18, wherein said start signal generation circuit comprises:
- a first signal generation circuit supplied with said clock signal, said first signal generation circuit advancing a phase of said clock signal substantially by a total of a first delay time caused when said first circuit outputs high level data and a second delay time caused when said second circuit outputs low level data;
- a second signal generation circuit having a delay time substantially equal to said second delay time of said second circuit, said second signal generation circuit delaying a signal outputted from said first signal generation circuit, and generating said first start signal for starting said first circuit of said shift register by using the delayed signal; and
- a third signal generation circuit having a delay time substantially equal to said first delay time of said first circuit, said third signal generation circuit delaying a signal outputted from said first signal generation circuit, and generating said second start signal for starting said second circuit of said shift register by using the delayed signal.

20. The circuit according to claim 18, wherein said parallel-to-serial conversion circuit comprises:
- a first buffer circuit supplied with said first data, said first buffer circuit outputting first data in response to a first control signal; and
- a second buffer circuit supplied with said second data, said second buffer circuit outputting second data in response to a second control signal.

* * * * *